US008858238B2

(12) United States Patent
Luo et al.

(10) Patent No.: US 8,858,238 B2
(45) Date of Patent: Oct. 14, 2014

(54) COMPRESSION CONNECTOR CONFIGURED WITH THREE HOUSING FOR RETAINING TERMINALS THERE BETWEEN

(75) Inventors: Yu Luo, Shenzhen (CN); Xing-Liang Liu, Shenzhen (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 71 days.

(21) Appl. No.: 13/607,816

(22) Filed: Sep. 10, 2012

(65) Prior Publication Data

US 2013/0065447 A1 Mar. 14, 2013

(30) Foreign Application Priority Data

Sep. 8, 2011 (CN) .......................... 2011 2 0336473

(51) Int. Cl.

| | |
|---|---|
| ***H01R 12/00*** | (2006.01) |
| ***H05K 1/00*** | (2006.01) |
| ***H01R 13/24*** | (2006.01) |
| ***H01R 12/70*** | (2011.01) |
| *H01R 12/71* | (2011.01) |

(52) U.S. Cl.

CPC ........ *H01R 13/2435* (2013.01); *H01R 12/7082* (2013.01); *H01R 12/712* (2013.01)

USPC ............................................. 439/66; 439/712

(58) Field of Classification Search

CPC ..... H01R 23/722; H01R 9/096; H01R 23/725

USPC .......... 439/66, 65, 91, 591, 862, 71, 712, 724

See application file for complete search history.

(56) References Cited

U.S. PATENT DOCUMENTS

| | | | | |
|---|---|---|---|---|
| 4,752,231 | A * | 6/1988 | Olsson | 439/66 |
| 5,498,166 | A * | 3/1996 | Rothenberger | 439/66 |
| 6,709,279 | B2 * | 3/2004 | Uratsuji | 439/71 |
| 7,011,555 | B2 * | 3/2006 | Pan | 439/862 |
| 7,878,818 | B2 | 2/2011 | Cheng et al. | |
| 8,282,431 | B1 * | 10/2012 | Zhang | 439/862 |
| 8,512,049 | B1 * | 8/2013 | Huber et al. | 439/66 |
| 8,523,615 | B2 * | 9/2013 | Luo et al. | 439/660 |
| 2006/0035484 | A1 * | 2/2006 | Hsu | 439/66 |
| 2012/0149248 | A1 * | 6/2012 | Luo et al. | 439/660 |

* cited by examiner

*Primary Examiner* — Hae Moon Hyeon

(74) *Attorney, Agent, or Firm* — Wei Te Chung; Ming Chieh Chang

(57) ABSTRACT

A compression connector for connecting two PCBs includes an insulative housing and a plurality of terminals received in the housing. Each terminal includes a retaining section and two spring contacting sections extending from opposite ends of the retaining section and exposing beyond mating surface of the housing. The insulative housing includes a base housing and a pair of matching housing sandwich the base housing from opposite directions to retain the retaining sections in said three housings such that the terminals can be well retained therein.

19 Claims, 7 Drawing Sheets

COMPRESSION CONNECTOR CONFIGURED WITH THREE HOUSING FOR RETAINING TERMINALS THERE BETWEEN

BACKGROUND OF THE INVENTION

1. Field of the Invention

The present invention relates generally to a compression connector which is configured with three housings to retain terminals therebetween.

2. Description of Related Arts

An electrical connector is disclosed in U.S. Pat. No. 7,878,818 issued to Cheng et al. on Feb. 1, 2011. Said connector includes an insulative housing and a plurality of terminals received in the housing. The housing has a top surface and a bottom surface opposite to each other. A number of terminal passageways are disposed through the top and bottom surfaces. Each of the terminals includes a base portion and two retaining portion extending from opposite sides of the base portion for securing the terminals in the terminal passageways. However, securing the terminals by this way generally causes the terminals break off the housing.

Hence, a compression connector to prevent terminals from breaking off the housing is desired.

SUMMARY OF THE INVENTION

Accordingly, an object of the present invention is to provide an electrical connector to prevent terminals from breaking off the housing.

To achieve the above object, a compression connector for mounting to two print circuit boards comprises an insulative housing and a plurality of terminals received in the housing. The insulative housing defining a first mating surface, a second mating surface opposite to the first mating surface, and a plurality of passageways disposed between and running through the first and second mating surfaces, the insulative housing comprising at least a base housing and a matching housing assembled to the base housing. A plurality of terminals received in the passageways, each of the terminals comprising a retaining section, two spring sections formed at two opposite sides of the retaining section, and a pair of contacting sections extending from the spring sections and projecting outwards the first and second mating surfaces respectively. The matching housing match with the base housing in a matching direction to form said passageways, the retaining sections of the terminals are retained between the base housing and the matching housing in a matching direction.

Other objects, advantages and novel features of the invention will become more apparent from the following detailed description when taken in conjunction with the accompanying drawings.

DETAILED DESCRIPTION OF THE PREFERRED EMBODIMENT

Figure 1:
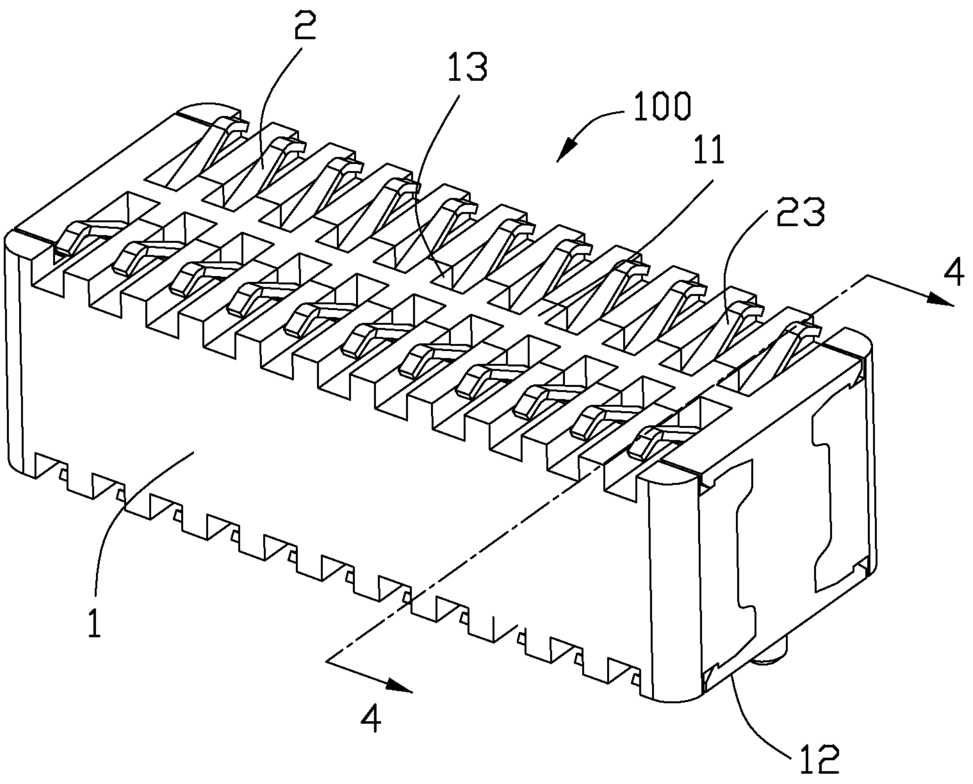
FIG. 1 is a perspective view of a compression connector in accordance with the present invention.

Reference will now be made to the drawing figures to describe the preferred embodiment of the present invention in detail.

Figure 2:
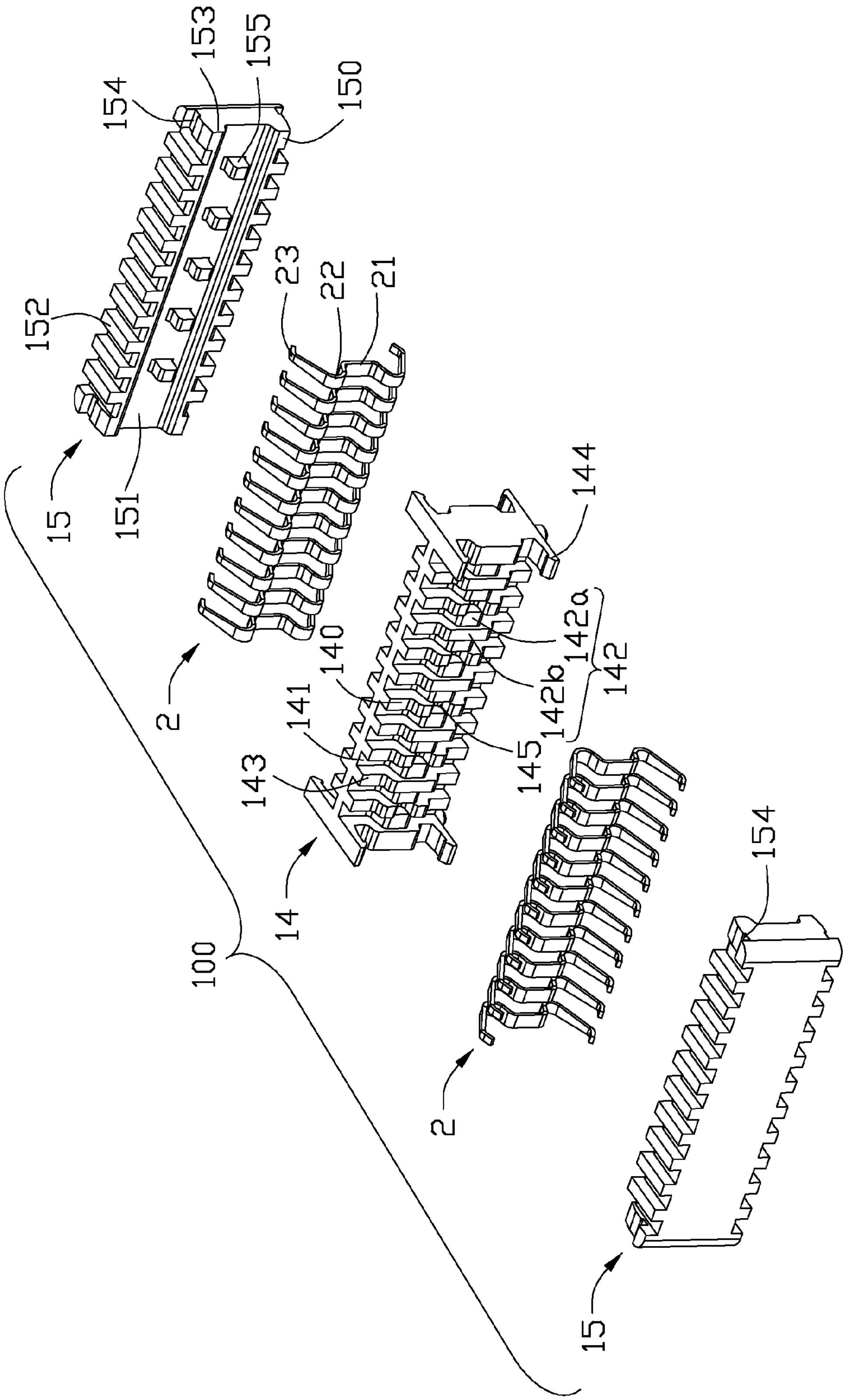
FIG. 2 is an exploded perspective view of the compression connector shown in FIG. 1.

Referring to FIGS. 1 and 2, a compression connector 100 of the present invention, used for connecting with two print circuit boards (not shown), includes an insulative housing 1 and a plurality of terminals 2 received in the housing 1. The insulative housing 1 includes a first mating surface 11 and a second mating surface 12 opposite to the first mating surface 11, and defines a plurality of passageways 13 disposed between and running through the first and second mating surface. Each of the terminals 2 includes two contacting sections projecting outwards the first and second mating surfaces respectively. The insulative housing 1 includes a base housing 14 and a pair of matching housings 15 combining with the opposite sides of the base housing 14, said matching housings 15 match with the base housing 14 to form the passageways 13, and a matching direction is defined between the base housing 14 and the matching housing 15. The base housing 14 defines a tuber 142 and the matching housing 15 defines a notch 151 matched with the tuber 142 in the matching direction, said the terminals 2 are retained between the tuber 142 and the notch 151 in the matching direction.

Figure 3:
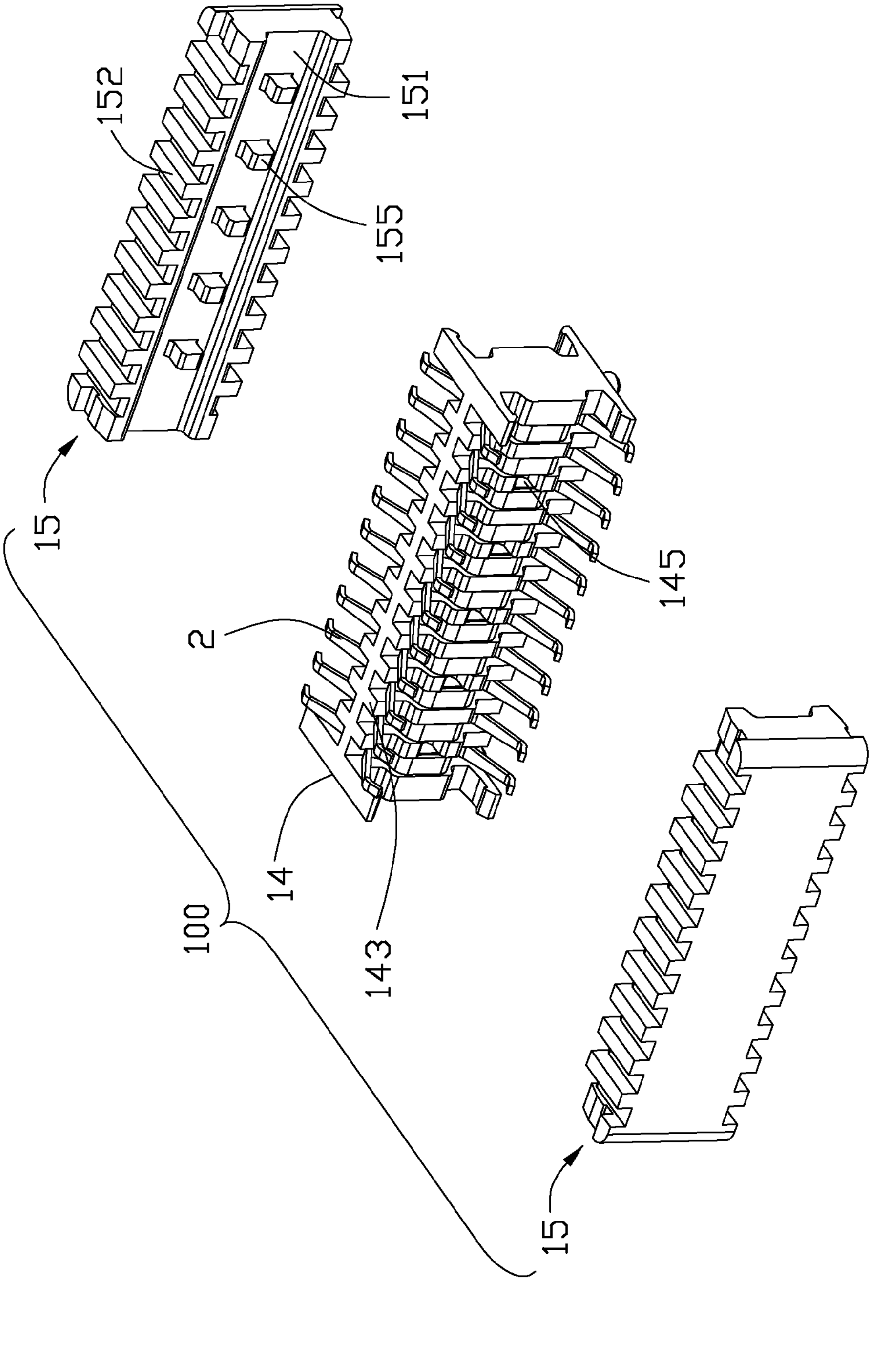
FIG. 3 is an exploded perspective view of the compression connector shown in FIG. 1, the terminals are arrange at the base housing.
Figure 4:
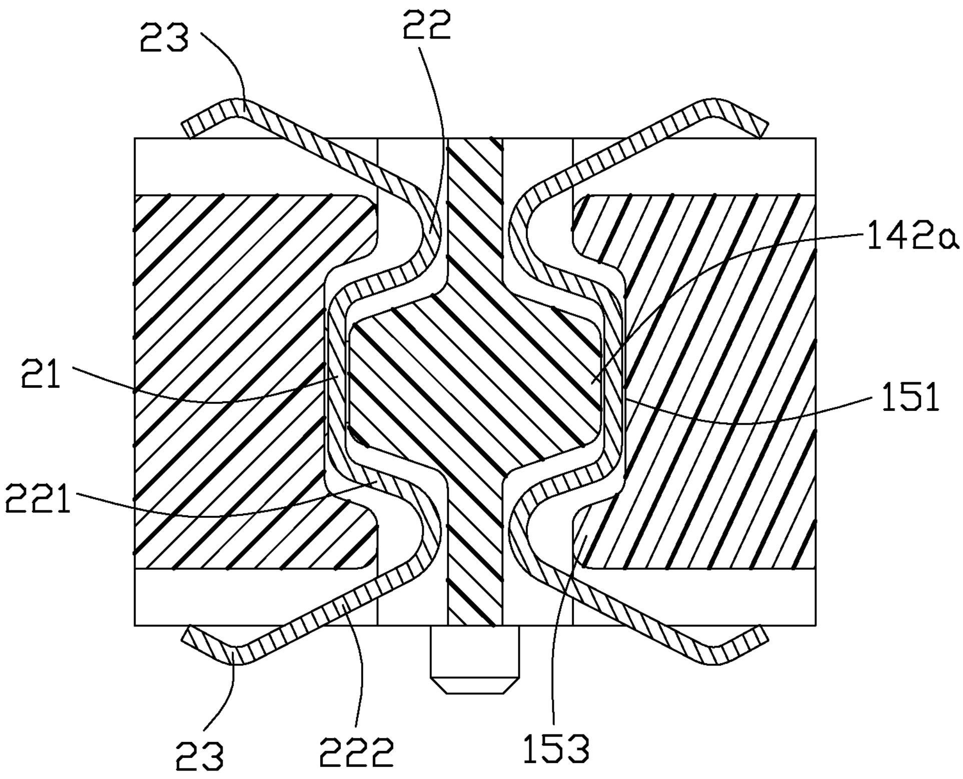
FIG. 4 is a cross section view of the compression connector taken along a broken line 4-4 in FIG. 1.

Referring to FIGS. 2 to 4, the base housing 14 is a lengthwise housing, Each matching housing 15 defines a first matching surface 140 for combining with one of the opposite sides of the base housing 14. The first matching surface 140 defines a plurality of first partitions 143 in the lengthwise direction and a plurality of slots 141 located between each two adjacent partitions. Each of the first partitions 143 extends in a height direction of the first matching surface 140, a tuber or protrusion **142*a* is protruded from a bottom surface of the slot 141 and a tuber or protrusion 142*b* is protruded from a bottom surface of the first partition 143 and each of the tuber is located in the middle of the first matching surface 140. The matching housing 15 has a second matching surface 150 matched with the first matching surface 140, said notch 151 is formed on the second matching surface 150 in a lengthwise direction and the notch 151 running through an opposite sides of the matching housing 15 in the lengthwise direction. A plurality of second partitions 152 are formed on a top surface of the matching housing 15. Each of the second partitions 152 is perpendicular to the second matching surface 150 for matching with the first partition 143. When the matching housing 15 combines with the base housing 14, said tubers 142*b* of the first partition 143 extend in the notch 151 and the slots 141 to form said passageways 13, said tuber 142*a* is lower than the tuber 142*b* so as to make the passageways 13** is through.

Each terminal 2 includes a retaining section 21, two spring sections 22 bending and extending symmetrically from upper and lower portions of the retaining section 21, and two contacting sections 23 extending from the spring sections 22. Said terminal roughly present as a "bow" shape. Combination with FIGS. 3 and 4, the spring section 22 has a first spring arm 221 bent and formed on the retaining section 22 and a second spring arm 222 bent and formed on the first spring arm 221 in an opposite direction, the first spring arm 221 and the second spring arm are commonly formed a opening having a "V"

shape and the opening faces to the second matching surface 150. When the two matching housings are matched with the opposite sides of the base housing respectively, the retaining section 21 is retained in the notch 151 through the tuber 142*a*, the retaining section is limited between the tuber and the notch so as to prevent terminals 2 from coming off the insulative housing 1. In a direction of the terminal 2 extending, the notch 151 has a larger size than the tuber 142*a* and a part of the spring section is movably located between the notch 151 and the tuber 142*a* in the height direction. Back referring to FIG. 4, a limit rib 153 is formed on opposite sides of the notch 151 of the second matching surface 150 in height direction for protruding into the "V"-shaped opening of the spring section 22. Said "V"-shaped spring section 22 can make the terminals 2 have a good elasticity, the size of the notch 151 is larger than the tuber 142*a* so as to make the spring section 22 of the terminals 2 have a activity space in the height direction and also can prevent terminals 2 from coming off the insulative housing 1. The tuber 142*b* of the first partition 143 is higher than the tuber 142*a* of the slot 141 in the matching direction and the height difference is equal to the thickness of the retaining section 21 of the terminals 2 and that is not only can retain the terminals 2 in the insulative housing 1 but also can prevent the adjacent terminals 2 moving in the lengthwise direction. The terminals 2 are symmetrically arranged on opposite sides of the base housing and each row of the terminals 2 is retained by a matching housing, the two rows of the contacting section of the terminal 2 are bent in an opposite direction.

A set of retaining hook arms 144 protrude from opposite sides of the first matching surface 140 and a set of retaining hook slots 154 are formed on opposite sides of the second matching surface 150 so as to make the base housing 14 reliably engage with the matching housing 15. Said tuber 142*b* defines a hole 145 and the notch 151 defines a post 155 combining with the hole 145, the hole 145 and the post 155 are used to improve the accuracy of combine the base housing 14 with the matching housing 15.

One side of the retaining section 21 abuts against the notch 151 and the other side abuts against the tuber 142*a*, said the retaining section is higher than the tuber 142*a* but lower than the notch 151 so that the retaining section 21 can do a slight movement between the tuber 142*a* and the notch 151. The slight movement allow the terminals adjust to a preferred work statue during the terminals are pressed inwards by the PCB.

Figure 5:
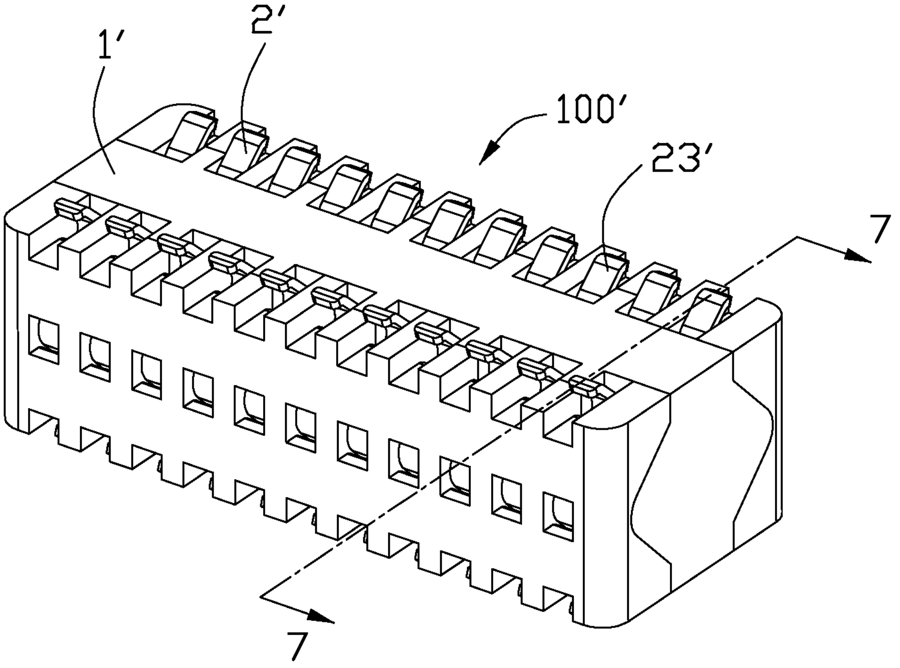
FIG. 5 is a perspective view of a second embodiment of a compression connector in accordance with the present invention.
Figure 6:
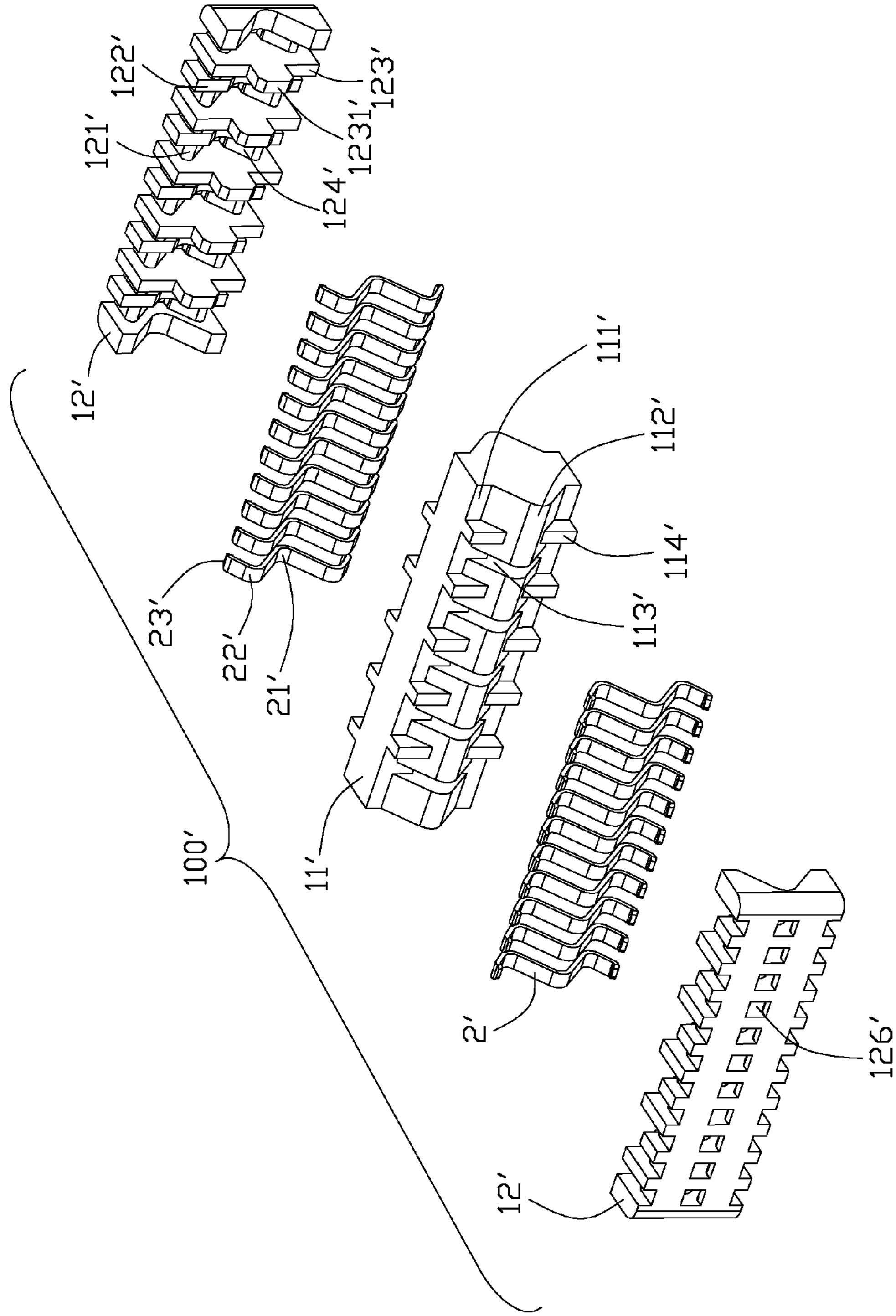
FIG. 6 is an exploded perspective view of the compression connector shown in FIG. 5.
Figure 7:
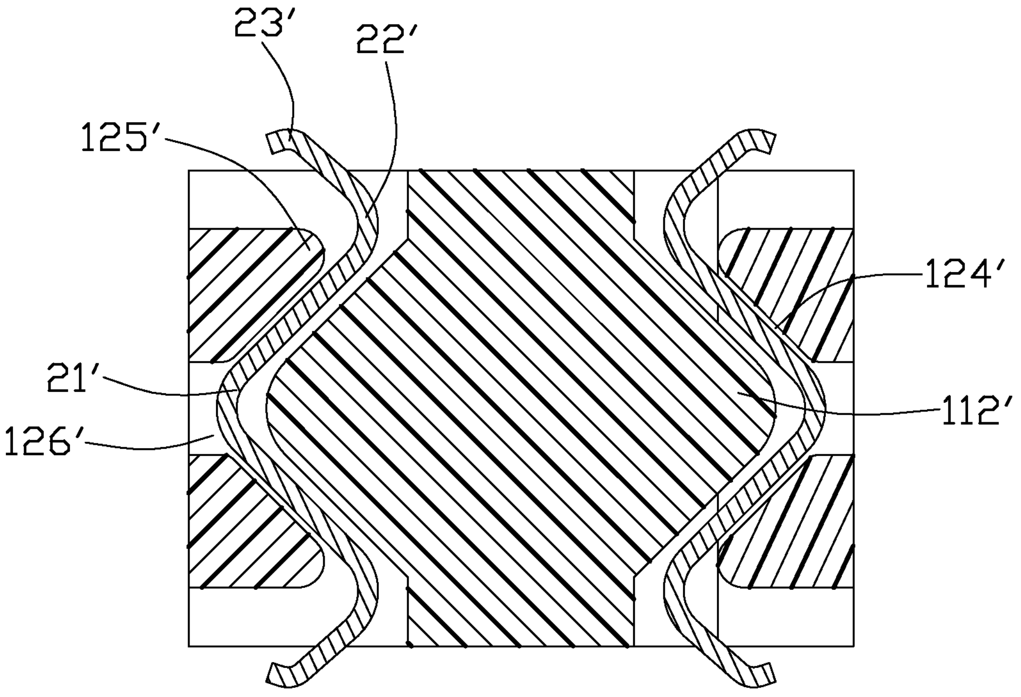
FIG. 7 is a cross section view of the compression connector taken along a broken line 7-7 in FIG. 5.

Referring to FIGS. 5 to 7, a second embodiment of the present invention. A compression connector 100' includes an insulative housing 1', said insulative housing includes a lengthwise base housing 11', two lengthwise matching housings 12' combined on opposite sides of the base housing 11' and a plurality of terminals 2' received between the base housing 11' and the matching housing 12'. Said terminals 2 defines a "V"-shaped retaining section 21' and two spring arms 22' extending on opposite sides of the retaining section to form a retaining section, each of the spring sections has a contacting section 23'. A pair of first matching surfaces 111' are defined on opposite sides of the base housing 11' and a plurality of "V"-shaped tuber 112' protrude on the first matching surface 111', a slot 113' is located between two adjacent tuber 112'. A first partition 114' is defined on the opposite sides of the tuber 112', said matching housings 12' defines a second matching surface 121' matched with the first matching surface 111', said matching surface 121' has a "V"-shaped notch 124' for matching with the "V"-shaped tuber 112' and a second partition 122' defined on opposite sides of the notch 124' in the height direction for matching with the first partition 114', said second matching surface 121' protrudes a third partition 123' for retaining between two adjacent tuber 112' and a convex edge 1231' is protruded from the third partition 123'. When the matching housing 12' combines with the base housing 11', one side of the retaining section 21' abuts against the notch 124' and the other side abuts against the tuber 112', said first partition 114' abuts against the second partition 122' and the third partition 123' abuts against between two adjacent tuber 112' and the convex edge 1231' of the third partition 123' is inserted into the slot 113', said these partitions setting is to prevent the terminals 2' moving in the lengthwise direction of the insulative housing. The spring arm 22' and the retaining section 21' commonly form an opening, a set of limiting ribs 125' are formed on opposite sides of the "V"-shaped retaining section 21' in the height direction for protruding into the opening so as to prevent the terminals 2' from coming off the insulative housing 1'. A hole 126' is defined on a bottom surface of the "V" shape notch 124', said hole 126' runs through the matching housing for receiving part of the retaining section during the terminals pressed by the PCB. In other words, the terminals has a large compression through the hole 126', said the large compression allow the terminals 2' adjust to a preferred work statue during the PCB is skew.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A compression connector comprising:

an insulative housing defining a first mating surface, a second mating surface opposite to the first mating surface, and a plurality of passageways disposed between and running through the first and second mating surfaces, the insulative housing comprising at least a base housing and two matching housing assembled to the base housing; and a plurality of terminals received in the passageways, each of the terminals comprising a retaining section, two spring sections formed at two opposite sides of the retaining section, and a pair of contacting sections extending from the spring sections and projecting outwards the first and second mating surfaces respectively;

wherein each of the matching housings matches with the base housing in a matching direction to form said passageways, the retaining sections of the terminals are retained between the base housing and the corresponding matching housing in said matching direction; wherein said two matching housings match with opposite sides of the base housing respectively, the base housing defines a set of tubers and each of the matching housings defines a set of notches corresponding to tubers in the matching direction, and said retaining sections are retained between the tubers and the notches.

2. The compression connector as claimed in claim 1, wherein the base housing is a lengthwise housing and defining a first matching surface, the first matching surface defines a plurality of first partitions in a lengthwise direction and a set of slots located between each two adjacent partitions, both the first partition and the slot formed the tuber, the matching housing has a second matching surface matched with the first matching surface, said second matching surface forms the notches in a lengthwise direction, the retaining section is sandwiched between the tuber of the slot and an inner surface of the notch.

3. The compression connector as claimed in claim 2, wherein the notch has a greater size than the tuber in an extending direction of the terminals, a part of the spring section is movably located between the notch and the tuber.

4. The compression connector as claimed in claim 3, wherein said two spring sections are symmetrically disposed at both ends of the retaining section, the spring section has a first spring arm bent and formed on the retaining section and a second spring arm bent and formed on the first spring arm in an opposite direction, the first spring arm and the second spring arm forms an opening facing the second matching surface, a limit rib is formed on opposite sides of the notch of the second matching surface in the height direction and protrude into the opening.

5. The compression connector as claimed in claim 4, wherein the tuber of the first partition is higher than the tuber of the slot and the height difference is similar to the thickness of the terminals.

6. The compression connector as claimed in claim 1, wherein the base housing is a lengthwise housing and defining a first matching surface, the first matching surface protrudes a tuber having a "V" shape, the matching housing has a second matching surface matched with the first matching surface, said second matching surface has a notch of a "V" shape for matching with the tuber, the terminals has a "V" shape retaining section, and the notch and the tuber are retained on both sides of the retaining section.

7. The compression connector as claimed in claim 6, wherein a bottom surface of the "V" shape notch defines a hole running through the matching housing.

8. The compression connector as claimed in claim 7, wherein each spring section is a spring arm symmetrically bent and formed at both ends of the "V"-shaped retaining section, each of the spring arms and the retaining sections form an opening, a limit rib is formed on an opposite sides of the "V"-shaped notch in a height direction for protruding into the opening.

9. The compression connector as claimed in claim 8, wherein the tubers are arranged along the lengthwise direction of the first matching surface and apart from each other, a first partition is defined on an opposite sides of the tuber in the height direction and a second partition is defined on an opposite sides of the notch in the height direction for matching with the first partition, a third partition retained between two adjacent tubers is protruded from the second matching surface.

10. A compression connector comprising:

an elongated insulative base housing extending along a lengthwise direction and defining opposite upper and lower mating faces in a vertical direction perpendicular to said lengthwise direction, and a pair of opposite side faces in a transverse direction perpendicular to both said lengthwise direction and said vertical direction;

a pair of rows of terminals respectively disposed upon said two opposite side faces, with opposite upper and lower contacting ends extending beyond the upper mating face and the lower mating face, respectively, under condition that said the pair of rows of terminals are assembled to said two opposite side faces along two opposite transverse directions toward each other; and a pair of mating housings assembled to the pair of opposite side faces of said base housing in said two opposite transverse directions, respectively, to respectively cooperate with the base housing for sandwiching the pair of rows of terminals therebetween in the transverse direction; wherein around each of said side faces of the base housing, at least either the base housing or the matching housing includes a plurality of protrusions in alignment and confrontation with the corresponding terminals in the vertical direction, respectively, so as to retain the corresponding terminals in position between the base housing and the corresponding matching housing without withdrawal when forces are applied to the upper contacting ends and the lower contacting ends of said terminals.

11. The compression connector as claimed in claim 10, wherein said protrusions are formed on the pair of opposite side faces of the base housing.

12. The compression connector as claimed in claim 10, wherein the base housing and the corresponding matching housings further form complementary interengaging structures thereon, respectively, beside the corresponding terminals, to have the base housing and the corresponding matching housings engage each other in both said vertical direction and said transverse direction.

13. The compression connector as claimed in claim 12, wherein the complementary interengaging structures include a plurality of posts received in corresponding holes, respectively.

14. The compression connector as claimed in claim 13, wherein the holes are formed in the pair of opposite side faces in a zigzag manner.

15. The compression connector as claimed in 10, wherein the base housing and the matching housings are assembled with each other in a symmetrical manner in the vertical direction with regard to the terminals for counterbalancing the forces applied upon the upper contacting ends and the lower contacting ends of the terminals.

16. The compression connector as claimed in claim 10, wherein the base housing defines a plurality of partitions along the lengthwise direction, each of said partitions extends in the transverse direction to form a plurality of passageways to receive the corresponding terminals therein, respectively, and said protrusions are respectively located in the corresponding passageways to hold the corresponding terminals, respectively.

17. The compression connector as claimed in 10, wherein the base hosing defines a plurality of first partitions all along the lengthwise direction each along the transverse direction, the matching housing defines a plurality of second partitions all along the lengthwise direction while each along the transverse direction, under condition that the first partitions and the second partitions are alternately arranged with each other along said lengthwise direction to form corresponding passageways each located between corresponding two neighboring first partition and second partition.

18. A compression connector comprising:

an elongated insulative base housing extending along a lengthwise direction and defining opposite upper and lower mating faces in a vertical direction perpendicular to said lengthwise direction, and a pair of opposite side faces in a transverse direction perpendicular to both said lengthwise direction and said vertical direction;

a pair of rows of terminals respectively disposed upon said two opposite side faces, with opposite upper and lower contacting ends extending beyond the upper mating face and the lower mating face, respectively, under condition that said the pair of rows of terminals are assembled to said two opposite side faces along two opposite transverse directions toward each other; and a pair of mating housings assembled to the pair of opposite side faces of said base housing in said two opposite transverse directions, respectively, to respectively cooperate with the base housing for sandwiching the pair of rows of terminals therebetween in the transverse direction;

via combining the a pair of mating housings to the base housing, a pair of rows of passageways are formed to receive said pair of rows of terminals, respectively, each of said passageways defines a serpentine configuration with a proper clearance with regard to the corresponding terminal so as to allow the corresponding terminal to be disposed therein at least in a vertically floating manner for compliance with deflection of the terminal.

19. The compression connector as claimed in claim 18, wherein said clearance is dimensioned to further allow the corresponding terminal to be floatable in the transverse direction.

* * * * *